(12) United States Patent
Hirata et al.

(10) Patent No.: US 7,527,668 B2
(45) Date of Patent: May 5, 2009

(54) METHOD FOR MANUFACTURING METAL FINE PARTICLES, METAL FINE PARTICLES MANUFACTURED THEREBY, AND COMPOSITION, LIGHT ABSORBING MATERIAL AND APPLIED PRODUCTS CONTAINING THE SAME

(75) Inventors: Hiroki Hirata, Saitama (JP); Yoshiaki Takata, Naka-gun (JP); Jun-etsu Satoh, Akita (JP); Daigou Mizoguchi, Hitachinaka (JP); Masato Murouchi, Otawara (JP)

(73) Assignees: Mitsubishi Materials Corporation, Tokyo (JP); Dai Nippon Toryo Co., Ltd., Osaka (JP)

( * ) Notice: Subject to any disclaimer, the term of this patent is extended or adjusted under 35 U.S.C. 154(b) by 203 days.

(21) Appl. No.: 11/571,316

(22) PCT Filed: Jul. 6, 2005

(86) PCT No.: PCT/JP2005/012463

§ 371 (c)(1),
(2), (4) Date: Dec. 27, 2006

(87) PCT Pub. No.: WO2006/006462

PCT Pub. Date: Jan. 19, 2006

(65) Prior Publication Data

US 2007/0243401 A1    Oct. 18, 2007

(30) Foreign Application Priority Data

Jul. 8, 2004    (JP)    ............................. 2004-201982
Sep. 24, 2004    (JP)    ............................. 2004-277152

(51) Int. Cl.
B22F 9/24    (2006.01)
(52) U.S. Cl. ...................................... 75/371

(58) Field of Classification Search ........................ None
See application file for complete search history.

(56) References Cited

U.S. PATENT DOCUMENTS 6,929,675 B1 *    8/2005    Bunge et al. .................. 75/362

(Continued)

FOREIGN PATENT DOCUMENTS

EP    1623954    2/2006

(Continued)

OTHER PUBLICATIONS

Ser-Sing Chang, et al., The Shape Transition of Gold Nanorods, Langmuir, 1999, 15, pp. 701-709.

(Continued)

*Primary Examiner*—George Wyszomierski
(74) *Attorney, Agent, or Firm*—Darby & Darby P.C.

(57) ABSTRACT

This method for manufacturing metal fine particles includes using an aqueous solution containing an amine having a reducing capacity and an ammonium salt having substantially no reducing capacity so as to reduce metal ions with said amine in a presence of said ammonium salt, thereby manufacturing rod-shaped metal fine particles. This metal fine particles are manufactured by this method for manufacturing metal fine particles, and have a major axis of 400 nm or less, a minor axis of 15 nm or less, and an aspect ratio of more than 1.

8 Claims, 1 Drawing Sheet

U.S. PATENT DOCUMENTS

| | | | |
|---|---|---|---|
| 7,329,301 B2* | 2/2008 | Chang et al. | 75/252 |
| 2004/0131538 A1* | 7/2004 | Ohzeki | 423/592.1 |
| 2006/0196309 A1 | 9/2006 | Niidome et al. | |
| 2006/0236813 A1* | 10/2006 | Zhao et al. | 75/711 |

FOREIGN PATENT DOCUMENTS

| | | |
|---|---|---|
| EP | 1661648 | 5/2006 |
| JP | 11-080647 A | 3/1999 |
| JP | 2001-064794 A | 3/2001 |
| JP | 2004238503 | 8/2004 |
| JP | 2004238504 | 8/2004 |

OTHER PUBLICATIONS

Yu-Ying Yu, et al., Gold Nanorods, Electrochemical Synthesis and Optical Properties, The Journal of Physical Chemistry B, vol. 101, No. 34, Aug. 21, 1997, pp. 6661-6664.

Nikhil R. Jana, et al., Wet Chemical Synthesis of High Aspect Ratio Cylindrical Gold Nanorods, J. Phys. Chem. B, 2001, 105, pp. 4065-4067.

Fraklin Kim, et al., Photochemical Synthesis of Gold Nanorods, J. Am. Chem. Soc., 124, 14316, 2002.

U.S. Appl. No. 11/721,108, filed Jun. 7, 2007.

* cited by examiner

METHOD FOR MANUFACTURING METAL FINE PARTICLES, METAL FINE PARTICLES MANUFACTURED THEREBY, AND COMPOSITION, LIGHT ABSORBING MATERIAL AND APPLIED PRODUCTS CONTAINING THE SAME

CROSS-REFERENCE TO PRIOR APPLICATIONS

This is a U.S. national phase application under 35 U.S.C. §371 of International Patent Application No. PCT/JP2005/012463, filed Jul. 6, 2005, and claims the benefit of Japanese Application No. 2004-201982, filed Jul. 8, 2004, and Japanese Application No. 2004-277152, filed Sep. 24, 2004, both of which are incorporated by reference herein. The International Application was published in Japanese on Jan. 19, 2006 as International Publication No. WO 2006/006462 A1 under PCT Article 21(2).

TECHNICAL FIELD

The present invention relates to rod-shaped metal fine particles (hereafter referred to as metal nanorods) with a major axis of no more than 400 nm, a minor axis of no more than 15 nm, and an aspect ratio of more than 1, as well as a method for manufacturing the particles, a composition containing the particles, and applications thereof.

BACKGROUND ART

When fine particles of metals are irradiated with light, a resonance absorption phenomenon known as plasmon absorption occurs. The absorption wavelength of this absorption phenomenon differs depending on the nature and shape of the metal particles. For example, it is known that a gold colloid containing fine spherical particles of gold dispersed in water has an absorption band near 530 nm, whereas if the shape of the fine particles is changed to a rod shape with a minor axis of 10 nm, then in addition to an absorption near 530 nm caused by the minor axis of the rods, the particles also exhibit an absorption at a longer wavelength caused by the major axis of the rods (S. S. Chang et al., Langmuir, 1999, 15, pp 701 to 709).

Conventional methods of synthesizing metal nanorods include electrochemical methods (Y. Y. Yu, S. S. Chang, C. L. Lee, C. R. C. Wang, J. Phys. Chem. B. 101, 6661 (1997)), chemical methods (N. R. Jana, L. Gearheart, C. J. Murphy, J. Phys. Chem. B, 105, 4065 (2001)), and photochemical methods (F. Kim, J. H. Song, P. Yang, J. Am. Chem. Soc., 124, 14316 (2002)). Furthermore, a method of preparing spherically shaped noble metal fine particles as colorants for coating materials and resin compositions, by dissolving a noble metal compound in a solvent, adding a high molecular weight dispersant, and then conducting a reduction is already known (Japanese Unexamined Patent Application, First Publication No. H11-80647). Moreover, a method that aims to form metal wiring patterns by supporting plasmon-absorbing inorganic fine particles on a solid surface and then growing the particles to a diameter of less than 100 nm and an aspect ratio of at least 1, thus generating fine rods, is also known (Japanese Unexamined Patent Application, First Publication No. 2001-064794).

An electrochemical method is a method in which metal ions eluted from the anode are reduced at the cathode, and then grown into rod-shaped fine particles through the action of a surfactant. This method requires an electrolysis apparatus, expensive conduction electrodes such as gold plates, platinum plates or silver plates, and an ultrasound irradiation device, and because the quantity of particles that can be manufactured is limited by the size of the apparatus, this method is unsuited to mass production. Furthermore, the aspect ratio of the metal nanorods varies with deterioration of the ultrasound irradiation device and variation in the quantity of silver eluted, meaning reproducibility tends to be problematic.

A chemical method is a method in which fine metal seeds are first prepared as growth nuclei, and these metal seeds are then added to a separately prepared growth liquid to grow rod-shaped particles. In this method, the usable time frame for the seeds is quite short, being only several hours, and the metal fine particles must be grown via a complex operation that involves stepwise growth with two or three stages. Moreover, other problems also arise in that reproducibility is difficult to achieve, and the concentration of the manufactured metal nanorods is low.

A photochemical method is a method in which metal ions in a surfactant-containing solution are irradiated with ultraviolet light over an extended period to generate metal nanorods. This method requires expensive equipment such as an ultraviolet light exposure apparatus. Furthermore, because production of the metal nanorods is restricted to the region undergoing light irradiation, there is a limit to the quantity of nanorods manufactured, meaning the method is unsuited to mass production.

In the production method described in Japanese Unexamined Patent Application, First Publication No. H11-80647, examples are presented in which amines are used as the reducing agent, but these reducing agents are not combined with a surfactant. Furthermore, although a high molecular weight dispersant is added, this dispersant is used as a protective colloid for the generated noble metal fine particles, and has no function in controlling the growth in the axial direction during formation of the noble metal fine particles. Accordingly, the noble metal fine particles that are manufactured are spherical fine particles, and rod-shaped metal fine particles are unobtainable.

The plasmon coloring of spherical gold fine particles manufactured using this method is blue, bluish-violet, or reddish violet, whereas spherical silver fine particles are yellow. These light absorption bands are limited to absorption in the vicinity of 530 nm for gold and absorption in the vicinity of 400 nm for silver, meaning there is a limit on the colors that can be used.

In addition, in conventional production methods, in those methods where metal fine particles are grown on the surface of a solid, the metal fine particles are supported on the solid surface, meaning they cannot be dispersed in various solvents or binders, and cannot be converted to paint form.

SUMMARY OF THE INVENTION

The present invention has been designed to overcome the aforementioned problems associated with conventional production methods. In other words, an object of the present invention is to provide a production method that enables metal nanorods to be manufactured easily and in large quantities and also facilitates regulation of the particle size, as well as metal fine particles obtained using this production method, and a composition, light absorbing material and applied products that contain such metal fine particles.

According to the present invention, a method for manufacturing metal fine particles of the following configuration is provided.

The method for manufacturing metal fine particles of the present invention includes using an aqueous solution containing an amine having a reducing capacity and an ammonium salt having substantially no reducing capacity so as to reduce metal ions with said amine in a presence of said ammonium salt, thereby manufacturing rod-shaped metal fine particles.

In the method for manufacturing metal fine particles of the present invention, a quaternary ammonium salt represented by a formula (1) shown below may be used as the aforementioned ammonium salt.

$$CH_3(CH_2)_n N^+(CH_3)_3 Br^- \quad (n = \text{an integer from 1 to 17}) \quad \text{Formula (1)}$$

The concentration within the aqueous solution of the ammonium salt represented by the above formula (1) may fall within a range from 0.01 to 1.0 mol/l.

As the aforementioned amine, either one or two or more selected from alkylamines and alkanolamines represented by formula (2) and (3) shown below may be used.

$$NR_3 \quad (R: C_n H_{2n+1} \text{ n=an integer from 1 to 8}) \quad \text{Formula (2)}$$

$$N(ROH)_3 \quad (R: C_n H_{2n} \text{ n=an integer from 1 to 8}) \quad \text{Formula (3)}$$

The concentration of the amine represented by the above formula (2) or (3) in the aforementioned aqueous solution may fall within a range from 0.001 to 10 wt %.

The dissociation constant (pKa value) of the amine represented by the above formula (2) or (3) may fall within a range from 7.0 to 12.5.

As the above amine, triethylamine, tributylamine, tripentylamine, or 2,2',2"-nitrilotriethanol may be used.

As the above amine, either one or two or more selected from alkylamines represented by formula (4) and (5) shown below may also be used.

$$H_2NR \quad (R: C_n H_{2n+1} \text{ n=an integer from 1 to 8}) \quad \text{Formula (4)}$$

$$HNR_2 \quad (R: C_n H_{2n+1} \text{ n=an integer from 1 to 8}) \quad \text{Formula (5)}$$

The concentration of the amine represented by the above formula (4) or (5) in the aforementioned aqueous solution may fall within a range from 0.001 to 10 wt %.

The dissociation constant (pKa value) of the amine represented by the above formula (4) or (5) may fall within a range from 7.0 to 12.5.

The particle size may be controlled by adjusting the concentrations of the aforementioned amine and the aforementioned ammonium salt.

The aspect ratio of the metal fine particles may be adjusted by adding a ketone to the aforementioned aqueous solution containing the amine and the ammonium salt.

Furthermore, the present invention also provides metal fine particles of the configuration described below, as well as a composition, light absorbing material and applied product containing these metal fine particles.

A first aspect of the metal fine particles of the present invention are manufactured using the method for manufacturing metal fine particles described above, and have a major axis of 400 nm or less, a minor axis of 15 nm or less, and an aspect ratio of more than 1.

A second aspect of the metal fine particles of the present invention are manufactured using the method for manufacturing metal fine particles described above and further being subjected to surface treatment with a non-aqueous dispersant having side chains that exhibit affinity for non-aqueous solvents.

A third aspect of the metal fine particles of the present invention are manufactured using the method for manufacturing metal fine particles described above, wherein the residual quantity of the ammonium salt on the surface of the metal fine particles is 15 parts or less by weight per 100 parts by weight of the metal fine particles.

A composition of the present invention includes metal fine particles that are manufactured using the method for manufacturing metal fine particles described above.

A composition of the present invention may further include a binder resin and a dispersion medium.

A composition of the present invention may further include either one or two or more selected from dyes, pigments, fluorescent materials, metal oxides, and metal nanofibers.

A light absorbing material of the present invention is formed using a composition described above, and is prepared in the form of a coating composition, a coating, a film, or a sheet material.

An applied product of the present invention contains metal fine particles manufactured using a method for manufacturing metal fine particles described above, and is used as an optical filter material, wiring material, electrode material, catalyst, colorant, cosmetic product, near infrared absorber, anti-counterfeit ink, electromagnetic shielding material, surface-enhanced fluorescent sensor, biological marker, nanowaveguide, recording material, recording element, polarization material, drug carrier for a drug delivery system (DDS), biosensor, DNA chip, or test drug.

According to a method for manufacturing metal fine particles of the present invention, by using the weak reducing capability of an amine in the presence of the surfactant action of an ammonium salt, a reaction system that gently generates metal nanorods is established. With this method, metal nanorods that are finer than conventional metal fine particles can be manufactured, and the plasmon absorption caused by the minor axis can be suppressed dramatically. Furthermore, in a production method of the present invention, the aspect ratio of the metal nanorods can be controlled by controlling the mixing ratio between the amine and the ammonium salt. As a result, metal nanorods with the desired light absorption characteristics can be manufactured with ease. In addition, a production method of the present invention enables the metal nanorods to be manufactured easily and in large quantities, and is consequently suited to practical applications.

DETAILED DESCRIPTION OF THE INVENTION

As follows is a more detailed description of the present invention based on embodiments of the present invention.

In a method for manufacturing metal fine particles according to the present invention, an aqueous solution that includes an amine with a reducing capacity and an ammonium salt that has substantially no reducing capacity is used for reducing metal ions with the amine in the presence of the ammonium salt, thereby manufacturing rod-shaped metal fine particles (hereafter referred to as metal nanorods).

Amines generally have weak reducing capacity, but in the present invention this weak reducing capacity of the amine is used in the presence of the surfactant action of the ammonium salt. As a result, a favorable reaction system that gently generates metal nanorods is established, and metal nanorods with finer particle sizes than those previously reported can be manufactured.

The ammonium salt that is used in combination with the amine can employ, for example, a quaternary ammonium salt represented by a formula (1) shown below.

$$CH_3(CH_2)_nN^+(CH_3)_3Br^- \quad (n=\text{an integer from 1 to 17}) \qquad \text{Formula (1)}$$

This quaternary ammonium salt is a water-soluble cationic surfactant, and when dissolved in water, is known to form a variety of micelles depending on the concentration. Generally, as the concentration of this ammonium salt increases, the form of the micelles changes from spherical micelles to rod-shaped micelles and then to plate-shaped micelles. In this method for manufacturing metal fine particles, by adjusting the concentration of this ammonium salt and utilizing the regularity of the above micelle structures, rod-shaped metal fine particles can be manufactured in preference to spherical metal fine particles.

Of the ammonium salts represented by the above formula (1), hexadecyltrimethylammonium bromide ($CT_{16}AB$), which represents the case where n=16, is preferred. If an ammonium salt other than $CT_{16}AB$ is used, the quantity of spherical fine particles manufactured tends to be greater than for the case where $CT_{16}AB$ is used. The concentration of the $CT_{16}AB$ aqueous solution is typically within a range from 0.01 to 1.0 mol/l, and is preferably from 0.08 to 0.80 mol/l. If the $CT_{16}AB$ concentration is less than 0.01 mol/l, the quantity of spherical fine particles generated tends to increase and the quantity of dissolved amine tends to decrease. In contrast, if the $CT_{16}AB$ concentration exceeds 1.0 mol/l, the viscosity of the solution tends to increase, and the reaction tends to take a longer period of time. The reaction also becomes undesirable from a cost perspective.

The amine that is used in combination with the ammonium salt can use, for example, either one or two or more selected from alkylamines and alkanolamines represented by the formulas (2) through (5) shown below.

$$NR_3 \quad (R: C_nH_{2n+1} \; n=\text{an integer from 1 to 8}) \qquad \text{Formula (2)}$$

$$N(ROH)_3 \quad (R: C_nH_{2n} \; n=\text{an integer from 1 to 8}) \qquad \text{Formula (3)}$$

$$H_2NR \quad (R: C_nH_{2n+1} \; n=\text{an integer from 1 to 8}) \qquad \text{Formula (4)}$$

$$HNR_2 \quad (R: C_nH_{2n+1} \; n=\text{an integer from 1 to 8}) \qquad \text{Formula (5)}$$

The above alkylamines and alkanolamines exhibit increasingly strong hydrophobic characteristics as the alkyl chain lengthens, and become more difficult to dissolve in water. However, by using the amine in combination with the aforementioned ammonium salt, and utilizing the emulsification action of this ammonium salt, the amine can be mixed into the reaction aqueous solution. The dissociation constant (pKa value) of these amines is preferably within a range from 7.0 to 12.5.

Examples of preferred alkylamines and alkanolamines include trialkylamines represented by the formula (2) with pKa values in the vicinity of 10.0, and 2,2',2"-nitriloethanol represented by the formula (3) and with a pKa value of approximately 7.8. The reduction rates of these amines are suitable for suppressing the generation of spherical fine particles, and promoting the preferential generation of rod-shaped fine particles.

Specific examples of preferred trialkylamines include trimethylamine, triethylamine, tripropylamine, tributylamine, tripentylamine, and trihexylamine. Of these, triethylamine is particularly advantageous for manufacturing rod-shaped metal fine particles with a narrow minor axis and a short major axis. Furthermore, tributylamine and tripentylamine have the effect of suppressing the generation of spherical fine particles and increasing the yield of rod-shaped metal fine particles. Compounds with longer alkyl chains than the specific examples listed above tend to suffer from inferior solubility in the reaction aqueous solution. Furthermore, the alkanolamine 2,2',2"-nitriloethanol also has the effect of suppressing the generation of spherical fine particles and increasing the yield of rod-shaped metal fine particles.

Conventionally used reducing agents such as sodium borohydride, hydrazine, and ascorbic acid have comparatively high reducing power, and consequently their reduction of metal ions is rapid. As a result, there is a strong tendency for spherical metal fine particles with comparatively large particle sizes to be manufactured, and obtaining metal nanorods is difficult.

The concentration of these amines within the reaction aqueous solution is typically within a range from 0.001 to 10 wt %, and is preferably from 0.01 to 5.0 wt %. If this concentration exceeds 10 wt %, not only does the amine not dissolve completely in the reaction aqueous solution containing the ammonium salt, but the reduction reaction of the metal ions occurs rapidly, which tends to result in the generation of a large quantity of spherical fine particles. In contrast, if the concentration is less than 0.001 wt %, the metal ions cannot be completely reduced, or even if reduction of the metal ions is possible, the reduction tends to require an inordinate period of time.

By adjusting the concentrations of the amine and the ammonium salt, the particle size of the metal fine particles can be controlled, enabling metal nanorods with finer particle sizes than conventional materials to be manufactured. Specifically, the amine and the ammonium salt are mixed together so as to achieve the respective concentration ranges described above. Within these concentration ranges, by increasing the concentration of the amine, for example, the reducing power can be increased, meaning that in the initial stages of synthesis, the quantity of fine seed particles that grow into metal nanorods can be increased. Then, as the fine seed particles grow, the metal ions within the synthesis solution are consumed, meaning there is a tendency for growth of the particles to stop while the particle size is still small, thus resulting in the generation of metal nanorods with very small particle sizes. On the other hand, by increasing the concentration of the ammonium salt, the viscosity of the synthesis solution can be increased, which slows the metal ion reduction reaction and the metal nanorods growth reaction. As a result, rapid reactions that are more likely to manufacture large particles are suppressed, resulting in a tendency for the generation of metal nanorods with very small particle sizes.

If required, various additives may also be added to the reaction aqueous solution containing the amine and the ammonium salt. In particular, addition of ketones enables adjustment of the aspect ratio of the metal fine particles. Amongst the possible ketones, acetone is the most preferred, and the quantity added is preferably within a range from 0 to 2 wt % of the aqueous solution. If this quantity is too small, the aspect ratio tends to be small, and the quantity of spherical fine particles generated tends to increase. In contrast if the quantity is too large, the aspect ratio increases. If the addition quantity described above exceeds 2 wt %, the aspect ratio increases, and the major axis length of the metal nanorods tends to lack uniformity. As a result, the particle size distribution for the metal nanorods broadens, meaning not only that a sharp absorption is not obtainable, but also that the quantity of spherical fine particles generated tends to increase. Moreover, addition of silver also enables adjustment of the aspect ratio of the metal nanorods.

In this method for manufacturing metal fine particles, because the metal nanorods are manufactured within an aqueous solution containing an amine and an ammonium salt, the ammonium salt is adsorbed to the surface of the generated metal nanorods. Because this ammonium salt is hydrophilic, metal nanorods with this surface-adsorbed ammonium salt are difficult to extract into an organic solvent (a non-aqueous solvent).

By surface treating these metal nanorods that contain surface-adsorbed ammonium salt with a solution containing a dispersant having side chains that exhibit affinity for non-aqueous solvents (referred to as a non-aqueous dispersant), the metal nanorods can be dispersed stably within a non-aqueous solvent. Examples of materials that can be used as this non-aqueous dispersant include polymer compounds containing elements that exhibit ready adsorption to the metal nanorods as adsorption sites within the polymer principal chain, and also containing a plurality of side chains with favorable affinity for non-aqueous solvents. Examples of elements that exhibit ready adsorption to the metal nanorods include nitrogen and sulfur in those cases where the metal is gold, silver or copper. The number average molecular weight of the polymer is typically within a range from 100 to 10,000, and preferably from 1,000 to 3,000. If the number average molecular weight is less than 1,000, the dispersion stability within non-aqueous solvents is inadequate. If the number average molecular weight exceeds 10,000, the solubility within non-aqueous solvents deteriorates, causing a loss in stability, and the dispersant itself becomes an impurity, which causes a deterioration in the performance (such as the electrical properties) of the metal nanorods.

Specific examples of commercially available non-aqueous dispersants that can be used include Solsperse 13940, Solsperse 24000SC, Solsperse 28000 and Solsperse 32000 (product names, manufactured by Avecia Ltd.), Flowlen DOPA-15B and Flowlen DOPA-17 (both product names, manufactured by Kyoeisha Chemical Co., Ltd.), Ajisper PB814 and Ajisper PB711 (both product names, manufactured by Ajinomoto-Fine-Techno Co., Inc.), and Disperbyk 160, Disperbyk 161, Disperbyk 162, Disperbyk 163, Disperbyk 183, Disperbyk 184 and Disperbyk 185 (brand names, manufactured by BYK-Chemie). For example, Solsperse 24000SC is a dispersant which contains a large quantity of nitrogen atoms, which exhibit a high degree of adsorption to the metal nanorods, as adsorption sites within the principal chain, and is also provided with side chains on the principal chain so as to form a so-called comb-shaped structure that exhibits favorable solubility in non-aqueous solvents such as aromatics, ketones and esters. By adsorbing to the surface of the metal nanorods via the nitrogen sites, this dispersant enables the metal fine particles to be dispersed stably within a non-aqueous solvent.

Any dispersants that contain sulfur and are soluble in non-aqueous solvents can be used as sulfur-containing non-aqueous dispersants, and compounds such as butanethiol, hexanethiol, octanethiol, decanethiol, and dodecanethiol can be used.

An example of a method of surface treating the metal fine particles with a non-aqueous dispersant uses a solution containing a non-aqueous dispersant dissolved in a non-aqueous solvent, and this solution is added to the aqueous dispersion of the metal nanorods, and another liquid (a desorption liquid) is added to dissolve or desorb the ammonium salt such as $CT_nAB$ adsorbed to the surface of the metal nanorods, thereby substituting the surface ammonium salt with the non-aqueous dispersant. This surface treatment enables metal nanorods that have been manufactured in an aqueous reaction solution to be extracted into a non-aqueous solvent.

The desorption liquid used for dissolving or desorbing the ammonium salt such as $CT_nAB$ may be any liquid that is hydrophilic and capable of increasing the solubility of the ammonium salt. Examples of liquids that can be used include alcohols such as methanol and ethanol, and ketones such as acetone, methyl ethyl ketone, and methyl isobutyl ketone.

The quantity used of the non-aqueous dispersant is typically within a range from 0.00001 to 20 parts by weight, and preferably from 0.0001 to 10 parts by weight, per 100 parts by weight of the non-aqueous solvent. If this quantity is too large, the addition is undesirable from a cost perspective, and the non-aqueous dispersant itself becomes an impurity, which causes a deterioration in the performance of the metal nanorods. In contrast, if the quantity added is too small, an adequate surface treatment effect is not obtained, and the metal nanorods are unable to be stably dispersed within the non-aqueous solvent, and become prone to aggregation.

Furthermore, the volume of the metal nanorods aqueous dispersion (containing 0.3 parts by weight of metal nanorods) relative to the non-aqueous solvent is typically from 0.01 to 10 times, and preferably from 0.1 to 1 times, the volume of the non-aqueous solvent. If the volume of the metal nanorods aqueous dispersion falls outside the above range, the metal nanorods are unable to be extracted stably into the non-aqueous solvent.

In addition to the surface treatment described above, other methods that can be used for reducing or removing the ammonium salt from the surface of the metal nanorods include (a) a precipitation method that involves addition of a poor solvent, and (b) methods that employ centrifugal separation or the like. In a precipitation method that uses addition of a poor solvent, a solvent that acts as a poor solvent for the ammonium salt adsorbed to the surface of the metal nanorods is added to the metal nanorods dispersion, thereby precipitating out the metal nanorods, and the ammonium salt that is extracted into the supernatant liquid is then removed. In a centrifugal separation method, the metal nanorods dispersion is caused to settle out through treatment in a centrifuge, and the ammonium salt that is extracted into the supernatant liquid is then removed.

By using a combination of the above surface treatment method, poor solvent precipitation method, and centrifugal separation method, the ammonium salt can be effectively removed from the metal nanorods surface. In one example, the metal nanorods are subjected to surface treatment using a non-aqueous dispersant that exhibits favorable affinity for the non-aqueous solvent toluene. The metal nanorods are then extracted into a small quantity of toluene, thereby forming a metal nanorods toluene paste, while simultaneously removing the majority of the ammonium salt. The poor solvent ethanol is then added to the thus obtained paste, thereby causing aggregation of the metal nanorods coated in the non-aqueous dispersant that exhibits affinity for toluene. Centrifuging is used to accelerate the speed at which this aggregate settles out, thus enabling precipitation of a metal nanorods aggregate within a relatively short period of time. The ammonium salt is soluble in ethanol, meaning the ammonium salt is extracted into the supernatant ethanol layer (which contains a portion of toluene). This supernatant liquid is separated, enabling recovery of the metal nanorods.

The precipitated metal nanorods coated with the dispersant that exhibits affinity for toluene can be re-dispersed within a small quantity of toluene, enabling the preparation of a paste with a reduced organic content. By repeating the treatment operation described above, metal nanorods can be obtained in which the ammonium salt has either been removed or significantly reduced. Products in which the quantity of ammonium salt has been reduced to no more than 15 parts by weight, and preferably no more than 5 parts by weight, per 100 parts by weight of the metal nanorods are ideal as conductive materials.

Using the production method described above, metal nanorods with a minor axis of no more than 15 nm, and preferably no more than 5 nm, can be manufactured easily and efficiently. The absorption wavelength band of the metal nanorods can be varied by adjusting the aspect ratio of the nanorods, and in the case where gold is used as the metal, specific absorption wavelengths within a wide range from visible light (near 530 nm) through to the near infrared region can be achieved.

The major axis of the manufactured metal nanorods is no more than 400 nm, and preferably no more than 200 nm. Provided the major axis of the metal nanorods is no more than 400 nm, recognizing the nanorods as individual particles with the naked eye is extremely difficult, and when a coating of the metal nanorods is applied as a filter or the like, a coating film with good transparency is obtained. In addition, the aspect ratio (major axis/minor axis) of the metal nanorods is more than 1, indicating rod-shaped particles. Metal fine particles with an aspect ratio of 1 are spherical, and are restricted to a light absorption band that is either near 530 nm in the case of gold, or near 400 nm in the case of silver, meaning a selective absorption effect at an arbitrary visible light or near infrared wavelength is unobtainable.

By mixing these metal fine particles (metal nanorods) with a dispersion medium and a binder (a resin), a metal nanorod-containing composition can be obtained. As this binder (resin), any of the various resins typically used for coating materials or molding purposes that exhibit favorable transparency for visible light through to light in the near infrared region can be used without any particular restrictions. Representative examples include various organic resins such as acrylic resins, polyester resins, alkyd resins, urethane resins, silicone resins, fluororesins, epoxy resins, polycarbonate resins, polyvinyl chloride resins and polyvinyl alcohols, as well as radical polymerizable oligomers or monomers (which in some cases may be combined with a curing agent or a radical polymerization initiator), and sol gel solutions that use an alkoxysilane for the resin skeleton.

In the metal nanorod-containing composition described above, if a solvent also needs to be added, the solvent may be suitably selected from those solvents capable of dissolving or stably dispersing the binder (resin). Representative examples of suitable solvents include water; alcohols such as methanol, ethanol, propanol, hexanol, and ethylene glycol; aromatic hydrocarbons such as xylene and toluene; alicyclic hydrocarbons such as cyclohexane; ketones such as acetone, methyl ethyl ketone, and methyl isobutyl ketone; esters such as ethyl acetate and butyl acetate; ethers such as ethylene glycol monobutyl ether; and mixtures of these solvents, although the solvent is not limited to the above solvents.

The quantity added of the metal nanorods is typically within a range from 0.01 to 1,900 parts by weight per 100 parts by weight of the binder. This addition quantity is preferably within a range from 0.1 to 50 parts by weight per 100 parts by weight of the binder in the case of optical applications, and within a range from 566 to 1,900 parts by weight per 100 parts by weight of the binder in the case of conductive applications. In the case of optical applications, if the addition quantity is less than the above range, the absorption is minimal and the desired color (or the desired reduction in transmittance in the case of a near infrared band) is unobtainable. Furthermore if the addition quantity is larger than the above range, the metal nanorods tend to aggregate together, meaning a sharp absorption cannot be obtained. In the case of conductive applications, if the addition quantity of the metal nanorods is less than the above range, the insulating effect of the binder increases, meaning obtaining favorable conduction properties becomes difficult. Furthermore, if the addition quantity is large than the above range, the metal nanorods become prone to aggregation, causing a deterioration in the storage stability as a coating material composition.

The metal nanorods blended into the binder (resin) have preferably had the quantity of ammonium salt residues reduced by surface treatment with a non-aqueous dispersant having side chains that exhibit affinity for non-aqueous solvents, or by a poor solvent precipitation method or a centrifugal separation method. With metal nanorods that have been surface treated with a non-aqueous dispersant, the quantity of the non-aqueous dispersant, in the case of optical applications, is typically within a range from 5 to 50 wt %, and preferably from 8 to 30 wt % relative to the metal nanorods. Outside this range, the metal nanorods tend to be prone to aggregation. Furthermore, in the case of conductive material applications, the quantity of the non-aqueous dispersant is preferably within a range from 8 to 15 wt % relative to the metal nanorods. If the quantity exceeds this range, the conductivity deteriorates.

Depending on the intended purpose, either one or two or more selected from dyes, pigments, fluorescent materials, metal oxides, and metal nanofibers may also be added to the metal nanorod-containing composition. Furthermore, if required, various other additives such as leveling agents and anti-foaming agents may also be added. The metal nanorods may all be of a single variety, or a combination of either two, or three or more different metal nanorods can also be used.

This metal nanorod-containing composition can be used in a multitude of forms, including as a coating material composition, a coating, a film, or a sheet material. Furthermore, the metal nanorod-containing composition can also be used as a composition for forming a light absorbing material, and by using such a metal nanorod-containing composition, a filter layer of a light absorbing material can be formed. Specific examples include (a) applying or printing the above metal nanorod-containing composition directly onto a substrate for which visible light or near infrared light absorption is required, thereby forming a cured coating that functions as a visible light or near infrared light absorption filter; (b) forming the above metal nanorod-containing composition into a film or sheet, and then using the resulting formed product of the composition as a visible light or near infrared light absorption filter, which is either laminated to, or wrapped around, a substrate for which visible light or near infrared light absorption is required; and (c) laminating the above coating or film formed from the metal nanorod-containing composition onto a transparent glass or plastic substrate, and then using this laminate as a visible light or near infrared light absorption filter, which is either laminated to, or wrapped around, a substrate for which visible light or near infrared light absorption is required.

In each of these potential uses, the thickness of the light absorption filter is typically within a range from approximately 0.01 μm to 1 mm, and if factors such as cost and light transmittance are taken into consideration, is preferably within a range from 0.1 μm to 100 μm.

The above coating, film, or sheet material formed from the metal nanorod-containing composition can be used as the filter layer of a light absorbing material. By equipping a substrate with a filter layer formed using this type of metal nanorod-containing composition, the resulting product can be used as a highly heat resistant light absorbing material such as a visible light or near infrared light-cut film, a visible light or near infrared light-cut filter, or a visible light or near infrared light-cut glass.

The metal nanorods described above have wavelength absorption characteristics that vary depending on the type of metal, the particle shape, and the aspect ratio. For example, in those cases where the metal is gold, depending on the aspect ratio, the metal nanorods have plasmon absorption characteristics at a higher wavelength than the vicinity of 530 nm, and also exhibit the high levels of heat resistance, weather resistance, and chemical resistance associated with gold. As a result, they are ideal as optical filter materials, high-grade colorants, near infrared absorbers, absorbers for anti-counterfeit inks, biosensors, DNA chips, and sensitizers for surface-enhanced fluorescent sensors. Furthermore, because gold is also a stable material within living organisms, the metal nanorods can also be used as the material for colorants for foodstuffs, colorants for cosmetic products, biological markers, drug carriers for drug delivery systems (DDS), and test drugs. Furthermore, because gold exhibits a high level of conductivity, the metal nanorods can also be used as wiring materials, electrode materials, and electromagnetic shielding materials. In addition, on the basis of their shape anisotropy, the metal nanorods can also be used as polarization materials, recording materials, recording elements, and nano-waveguides. For example, gold nanorods with an aspect ratio of 4.5, for which the plasmon absorption caused by the major axis occurs at 800 nm, can be incorporated within a film that does not absorb light of 800 nm, with the major axes of the gold nanorods aligned in a uniform direction. If light of 800 nm is shone onto this film, light with a polarization plane parallel to the major axis of the gold nanorods is absorbed strongly, whereas light with a polarization plane parallel to the minor axis of the gold nanorods undergoes minimal absorption. As a result, light that passes through this film is substantially light for which the polarization plane is parallel to the minor axis of the gold nanorods. In this manner, by aligning the gold nanorods, polarization characteristics can be achieved, enabling the nanorods to be used as a polarization material.

Moreover, because the nanorods are fine particles with a large surface area, they are also ideal as materials for providing a site for catalytic reactions.

EXAMPLES

The present invention is described below in more detail, based on a series of examples and comparative examples. Each example relates to gold nanorods, which mainly exhibit light absorption capabilities in the wavelength band from 530 nm to 1150 nm. However, by adjusting conditions such as the variety, the length, and the composition of the metal nanorods, similar light absorption capabilities can be achieved at even higher wavelength bands.

A particle image of each of the obtained metal nanorods was inspected using a transmission electron microscope (TEM), and an image analysis method was used to determine the major axis, minor axis, and aspect ratio for the observed particles. The respective average values were then calculated based on the number of particle measurements conducted, thus yielding major axis, minor axis, and aspect ratio values for the metal nanorods. Furthermore, the spectroscopic characteristics were measured using a V-570 apparatus manufactured by JASCO Corporation. The resistivity value was measured using a Loresta GP, manufactured by Mitsubishi Chemical Corporation.

Figure 1:
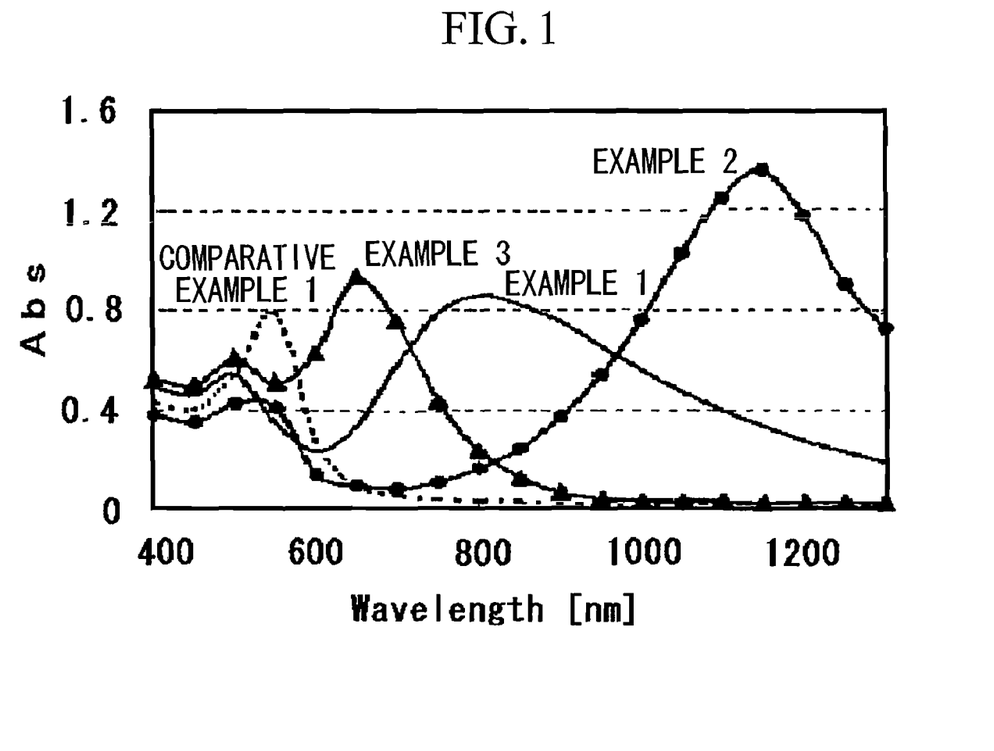
FIG. 1 is a diagram showing the absorption spectra for gold fine particles of examples 1 to 3 and comparative example 1.
Figure 2:
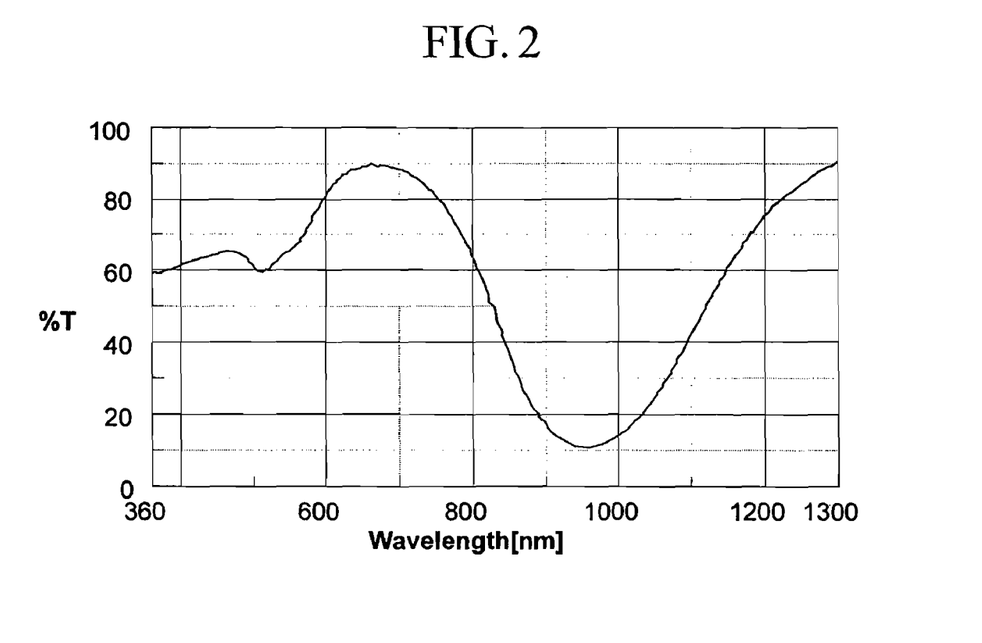
FIG. 2 is a diagram showing the absorption spectrum for gold fine particles of example 10.

The production conditions and results for each of the examples are shown in Table 1 through Table 3. The optical characteristics of the metal nanorods obtained in each of the examples are shown in FIG. 1 through FIG. 2.

TABLE 1

|  | Example | | | | | Comparative Example |
|---|---|---|---|---|---|---|
|  | 1 | 2 | 3 | 4 | 5 | 1 |
| 0.08 mol/l $CT_{16}AB$ aqueous solution | 10 |  | 10 |  |  |  |
| 0.56 mol/l $CT_{16}AB$ aqueous solution |  | 10 |  | 10 | 10 |  |
| 0.08 mol/l sodium dodecyl sulfate |  |  |  |  |  | 10 |
| Triethylamine (pKa = 10.7) | 0.05 |  | 0.05 |  |  | 0.05 |
| Tributylamine |  |  |  | 0.09 |  |  |
| Tripentylamine |  |  |  |  | 0.1 |  |
| 2,2',2''-nitrilotriethanol (pKa = 7.8) |  | 0.1 |  |  |  |  |
| Aniline (pKa = 4.7) |  |  |  |  |  |  |
| 0.01 mol/l silver nitrate aqueous solution | 0.6 | 0.42 | 0.6 | 0.6 | 0.6 | 0.6 |
| 0.024 mol/l chloroauric acid aqueous solution | 0.8 | 0.8 | 0.8 | 0.8 | 0.8 | 0.8 |
| Acetone | 0.2 | 0.2 | 0 | 0.2 | 0.2 | 0.2 |
| Minor axis length [nm] | 4 | 8 | 3.4 | 8 | 8 | 100 |
| Major axis length [nm] | 20 | 88 | 6.8 | 49 | 88 | 100 |
| Aspect ratio | 5 | 11 | 2 | 6 | 11 | 1 |
| Absorption wavelength peak position [nm] | 810 | 1150 | 658 | 980 | 1200 | 536 |

(Note):
units are ml.

TABLE 2

|  | Type | Example 6 | Example 7 | Comparative Example 2 |
|---|---|---|---|---|
| Gold nanorods aqueous dispersion | Content: 0.03 wt % | 250 | 250 | 250 |
| Nitrogen-containing dispersant | Solsperse 24000SC | 1 | | |
| Thiol group-containing dispersant | Dodecanethiol | | 1 | |
| Non-aqueous solvent | Toluene | 100 | | 100 |
|  | n-hexane | | 100 | |
| Water-based dispersant solvent | Ethanol | 500 | | 500 |
|  | Acetone | | 500 | |
| Gold nanorods extraction ratio [%] | Aqueous phase | 1 | 1 | 99 |
|  | Non-aqueous phase | 99 | 99 | 1 |
| Dispersion stability in non-aqueous solvent | *1 | At least 90 days | At least 90 days | aggregated |

(Note):
units are ml.
*1 Number of days before precipitation and aggregation of gold nanorods was noticed.

TABLE 3

| | | Example 8 | Example 9 | Comparative Example 3 |
|---|---|---|---|---|
| Metal nanorods | Minor axis length | 4 | 3.4 | 4 |
| | Major axis length | 20 | 6.8 | 20 |
| | Aspect ratio | 5 | 2 | 5 |
| Method for refining paste | | Aggregation + centrifugal separation | Aggregation + centrifugal separation | none |
| Organic components within paste | | 0.5 wt % | 0.5 wt % | 25.0 wt % |
| Resistivity [Ω · cm] | | $1 \times 10^{-5}$ | $1 \times 10^{-4}$ | No conductivity |

Example 1

0.05 ml of triethylamine (pKa=10.7) was added to, and dissolved in, 10 ml of a 0.08 mol/l aqueous solution of hexadecyltrimethylammonium bromide ($CT_{16}AB$). 0.6 ml of a 0.01 mol/l aqueous solution of silver nitrate was then added as an aspect ratio regulating agent. To the resulting aqueous solution was added 0.8 ml of a 0.024 mol/l aqueous solution of chloroauric acid, immediately followed by 0.2 ml of acetone, and the resulting mixture was held at 30° C. for 4 hours.

As a result, gold nanorods with a minor axis length of approximately 4 nm, a major axis length of approximately 20 nm, an aspect ratio of approximately 5, and an absorption wavelength peak in the vicinity of 810 nm were obtained.

Example 2

0.10 ml of 2,2',2"-nitrilotriethanol (pKa=7.8) was added to, and dissolved in, 10 ml of a 0.56 mol/l aqueous solution of hexadecyltrimethylammonium bromide ($CT_{16}AB$). 0.42 ml of a 0.01 mol/l aqueous solution of silver nitrate was then added. To the resulting aqueous solution was added 0.8 ml of a 0.024 mol/l aqueous solution of chloroauric acid, immediately followed by 0.2 ml of acetone, and the resulting mixture was held at 30° C. for 48 hours.

As a result, gold nanorods with a minor axis length of approximately 8 nm, a major axis length of approximately 88 nm, an aspect ratio of approximately 11, and an absorption wavelength peak in the vicinity of 1150 nm were obtained.

Example 3

0.05 ml of triethylamine (pKa=10.7) was added to, and dissolved in, 10 ml of a 0.08 mol/l aqueous solution of hexadecyltrimethylammonium bromide ($CT_{16}AB$). 0.6 ml of a 0.01 mol/l aqueous solution of silver nitrate was then added. To the resulting aqueous solution was added 0.8 ml of a 0.024 mol/l aqueous solution of chloroauric acid. At this point, a different procedure from the examples 1 and 2 was used in that no acetone was added. The resulting mixture was held at 30° C. for 4 hours.

As a result, gold nanorods with a minor axis length of approximately 3.4 nm, a major axis length of approximately 6.8 nm, an aspect ratio of approximately 2, and an absorption wavelength peak in the vicinity of 658 nm were obtained.

Example 4

0.09 ml of tri-n-butylamine was added to, and dissolved in, 10 ml of a 0.56 mol/l aqueous solution of hexadecyltrimethylammonium bromide ($CT_{16}AB$). 0.6 ml of a 0.01 mol/l aqueous solution of silver nitrate was then added as an aspect ratio regulating agent. To the resulting aqueous solution was added 0.8 ml of a 0.024 mol/l aqueous solution of chloroauric acid, immediately followed by 0.2 ml of acetone, and the resulting mixture was held at 30° C. for 24 hours.

As a result, gold nanorods with a minor axis length of approximately 8 nm, a major axis length of approximately 49 nm, an aspect ratio of approximately 6, and an absorption wavelength peak in the vicinity of 980 nm were obtained.

Example 5

0.1 ml of tri-n-pentylamine was added to, and dissolved in, 10 ml of a 0.56 mol/l aqueous solution of hexadecyltrimethylammonium bromide ($CT_{16}AB$). 0.6 ml of a 0.01 mol/l aqueous solution of silver nitrate was then added as an aspect ratio regulating agent. To the resulting aqueous solution was added 0.8 ml of a 0.024 mol/l aqueous solution of chloroauric acid, immediately followed by 0.2 ml of acetone, and the resulting mixture was held at 30° C. for 48 hours.

As a result, gold nanorods with a minor axis length of approximately 8 nm, a major axis length of approximately 88 nm, an aspect ratio of approximately 11, and an absorption wavelength peak in the vicinity of 1200 nm were obtained.

Example 6

To 250 parts by weight of the gold nanorods aqueous dispersion manufactured in the example 1 was added 100 parts by weight of toluene containing 1 wt % of the nitrogen-containing dispersant Solsperse 24000SC dissolved therein, and the mixture was stirred for 3 minutes. 500 parts by weight of ethanol was then added to the mixture, stirring was continued for a further 5 minutes, and following completion of this stirring, the mixture was left to stand for 24 hours. The mixture separated clearly into two layers, wherein the lower layer was a transparent aqueous layer, and the upper layer was a toluene layer containing the gold nanorods dispersed therein.

The upper layer was recovered, and measurement of the gold content by ICP revealed that the metal nanorods, which had been surface treated with the dispersant, had been substantially extracted into the non-aqueous solvent. Furthermore, when the storage stability was evaluated, the dispersion was stable for 90 days and longer.

Example 7

To 250 parts by weight of the gold nanorods aqueous dispersion manufactured in the example 1 was added 100 parts by weight of n-hexane containing 1 wt % of the sulfur-containing dispersant dodecanethiol dissolved therein, and the mixture was stirred for 3 minutes. 500 parts by weight of acetone was then added to the mixture, stirring was continued for a further 5 minutes, and following completion of this stirring, the mixture was left to stand for 24 hours. The mixture separated clearly into two layers, wherein the lower layer was a transparent aqueous layer, and the upper layer was a n-hexane layer containing the gold nanorods dispersed therein.

The upper layer was recovered, and measurement of the gold content by ICP revealed that the metal nanorods, which had been surface treated with the dispersant, had been substantially extracted into the non-aqueous solvent. Furthermore, when the storage stability was evaluated, the dispersion was stable for 90 days and longer.

Example 8

Using an evaporator, the toluene was removed from the gold nanorods toluene dispersion extracted in the example 4, thus yielding a toluene paste containing 5 wt % of gold nanorods. When the heating residue of the paste was measured by Tg-DTA, the paste was found to contain organic components of 25 wt % ($CT_{16}AB$, Solsperse 24000SC, and triethylamine).

When 100 parts by weight of ethanol, which is a poor solvent for the Solsperse 24000SC, was added to 100 parts by weight of the paste, an aggregate containing the Solsperse 24000SC and the gold nanorods was formed. This mixture was then subjected to centrifugal separation for 30 minutes at 40,000 G, which caused the aggregate to settle out, and enabled the supernatant ethanol solution containing the $CT_{16}AB$ and triethylamine to be removed. The settled precipitate was re-dispersed in toluene, yielding a toluene dispersion containing 5 wt % of the gold nanorods. Measurement of the heating residue of this dispersion by Tg-DTA revealed that the organic components within the paste had been reduced to 0.5 wt %.

This gold nanorods toluene paste was applied using a bar coater #40 and then heated for 30 minutes at 300° C., and subsequent measurement of the resistivity of the coated film following heating revealed a resistivity value of $1\times10^{-5}$ $\Omega\cdot$cm.

Example 9

The gold nanorods manufactured in the example 3 were subjected to the same surface treatment as that described in the example 4. Using the same method as the example 6, the gold nanorods were then converted to paste form, and the organic components were removed to reduce the residual organic components to 0.5 wt %, thereby yielding a gold nanorods toluene dispersion containing 5 wt % of gold nanorods.

This gold nanorods toluene paste was applied using a bar coater #40 and then heated for 30 minutes at 300° C., and subsequent measurement of the resistivity of the coated film following heating revealed a resistivity value of $1\times10^{-4}$ $\Omega\cdot$cm.

Example 10

Gold nanorods with a minor axis of 5 nm and a major axis of 35 nm (an aspect ratio of 7.0, and an absorption wavelength peak of 950 nm), a binder, and a solvent were mixed together in the proportions shown in Table 4 to generate a coating material, thus yielding a composition for forming a light absorbing material. This coating material was applied to a glass substrate using a spin coater, and following standing for 5 minutes, was cured by irradiation with ultraviolet light from a high pressure mercury lamp, thereby forming a light absorbing material filter.

The transmittance of this filter was measured. The result is shown in Table 4. Furthermore, the spectroscopic characteristics are shown in FIG. 2. The transmittance in the visible light region was 60%, indicating a high level of transmittance, whereas the transmittance in the vicinity of the gold nanorods plasmon absorption peak at 950 nm was 11%, indicating an excellent level of cutting.

TABLE 4

|  | Type | Example 10 |
| --- | --- | --- |
| Binder | Acrylic-based UV-curable resin | 100 |
| Polymerization initiator | α-hydroxyketone | 3 |
| Metal nanorods | Gold nanorods | 2 |
| Solvent | toluene | 100 |

TABLE 4-continued

| Type | | Example 10 |
|---|---|---|
| Transmittance [%] | 952 nm | 11 |
| | 510 nm | 60 |

(Note)
Gold nanorods: absorption wavelength at 950 nm (aspect ratio 7.0), film thickness: 6 μm Comparative Example 1

0.05 ml of triethylamine (pKa=10.7) was added to, and dissolved in, 10 ml of a 0.08 mol/l aqueous solution of sodium dodecyl sulfate. 0.6 ml of a 0.01 mol/l aqueous solution of silver nitrate was then added. To the resulting aqueous solution was added 0.8 ml of a 0.024 mol/l aqueous solution of chloroauric acid, immediately followed by 0.2 ml of acetone, and the resulting mixture was stored at 30° C. for 4 hours.

As a result, the obtained gold fine particles were spherical gold fine particles with an aspect ratio of approximately 1, and rod-shaped fine particles were not obtained.

Comparative Example 2

To 250 parts by weight of the gold nanorods aqueous dispersion manufactured in the example 1 was added 100 parts by weight of toluene, and the mixture was stirred for 3 minutes. 500 parts by weight of ethanol was then added to the mixture, stirring was continued for a further 5 minutes, and following completion of this stirring, the mixture was left to stand for 24 hours.

Almost no extraction of the thus manufactured metal nanorods into the non-aqueous solvent occurred. Furthermore, the $CT_{16}AB$ adsorbed to the gold nanorods was desorbed from the surface of the gold nanorods and dissolved by the ethanol. As a result, the gold nanorods aggregated together and settled out in the bottom of the vessel as lumps, which could not be re-dispersed within water or non-aqueous solvents.

Comparative Example 3

Using an evaporator, the toluene was removed from the gold nanorods toluene dispersion extracted in the example 4, thus yielding a toluene paste containing 5 wt % of gold nanorods.

When the heating residue of the paste was measured by Tg-DTA, the paste was found to contain organic components of 25 wt % ($CT_{16}AB$, Solsperse 24000SC, and triethylamine). This gold nanorods toluene paste was applied using a bar coater #40 and then heated for 30 minutes at 300° C., but when the resistivity of the coated film following heating was measured, no conductivity could be confirmed.

In a method for manufacturing metal fine particles according to the present invention, metal nanorods that are finer than conventional metal fine particles can be manufactured, and the plasmon absorption caused by the minor axis can be suppressed dramatically. Because metal nanorods with the desired light absorption characteristics can be manufactured easily and in large quantities, the present invention is particularly suited to practical applications.

The metal fine particles manufactured have targeted light absorption characteristics, and are useful as a light absorbing material, optical filter material, wiring material, electrode material, catalyst, colorant, cosmetic product, near infrared absorber, anti-counterfeit ink, electromagnetic shielding material, surface-enhanced fluorescent sensor, biological marker, nano-waveguide, recording material, recording element, polarization material, drug carrier for a drug delivery system (DDS), biosensor, DNA chip, or test drug.

The invention claimed is:

1. A method for manufacturing metal fine particles, the method comprising the steps of using an aqueous solution containing an amine having a reducing capacity and an ammonium salt having substantially no reducing capacity so as to reduce metal ions with said amine in a presence of said ammonium salt, thereby manufacturing rod-shaped metal fine particles, wherein at least one selected from alkylamines and alkanolamines represented by formula (2) to (5) shown below is used as said amine:

$NR_3$ (R: $C_nH_{2n+1}$ n=an integer from 1 to 8)  Formula (2);

$N(ROH)_3$ (R: $C_nH_{2n}$ n=an integer from 1 to 8)  Formula (3);

$H_2NR$ (R: $C_nH_{2n+1}$ n=an integer from 1 to 8)  Formula (4); and $HNR_2$ (R: $C_nH_{2n+1}$ n=an integer from 1 to 8)  Formula (5).

2. A method for manufacturing metal fine particles according to claim 1, wherein a quaternary ammonium salt represented by a formula (1) shown below is used as said ammonium salt:

$CH_3(CH_2)_nN^+(CH_3)_3Br^-$ (n=an integer from 1 to 17)  Formula (1).

3. A method for manufacturing metal fine particles according to claim 2, wherein a concentration of said ammonium salt represented by said formula (1) in said aqueous solution is within a range from 0.01 to 1.0 mol/l.

4. A method for manufacturing metal fine particles according to claim 1, wherein a concentration of said amine represented by said formula (2) to (5) is within a range from 0.001 to 10 wt %.

5. A method for manufacturing metal fine particles according to claim 1, wherein a dissociation constant (pKa value) of said amine represented by said formula (2) to (5) is within a range from 7.0 to 12.5.

6. A method for manufacturing metal fine particles according to claim 1, wherein triethylamine, tributylamine, tripentylamine, or 2,2',2"-nitrilotriethanol is used as said amine.

7. A method for manufacturing metal fine particles according to claim 1, wherein particle size is controlled by adjusting concentrations of said amine and said ammonium salt.

8. A method for manufacturing metal fine particles according to claim 1, further comprising the step of adjusting an aspect ratio of said metal fine particles by adding a ketone to said aqueous solution containing said amine and said ammonium salt.

* * * * *